US007865861B2

United States Patent
Habitz et al.

(10) Patent No.: US 7,865,861 B2
(45) Date of Patent: *Jan. 4, 2011

(54) METHOD OF GENERATING WIRING ROUTES WITH MATCHING DELAY IN THE PRESENCE OF PROCESS VARIATION

(75) Inventors: Peter A. Habitz, Hinesburg, VT (US); David J. Hathaway, Underhill, VT (US); Jerry D. Hayes, Milton, VT (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 262 days.

This patent is subject to a terminal disclaimer.

(21) Appl. No.: 12/107,158

(22) Filed: Apr. 22, 2008

(65) Prior Publication Data

US 2008/0195993 A1 Aug. 14, 2008

Related U.S. Application Data

(63) Continuation of application No. 10/908,102, filed on Apr. 27, 2005, now Pat. No. 7,418,689.

(51) Int. Cl.
*G06F 17/50* (2006.01)
(52) U.S. Cl. .......................................... 716/14
(58) Field of Classification Search .............. 716/6, 716/12–14
See application file for complete search history.

(56) References Cited

U.S. PATENT DOCUMENTS

| 5,109,168 | A | 4/1992 | Rusu |
| 5,550,748 | A | 8/1996 | Xiong |
| 6,311,313 | B1 | 10/2001 | Camporese et al. |
| 6,466,008 | B1 | 10/2002 | Fung et al. |
| 7,003,754 | B2 * | 2/2006 | Teig et al. ............... 716/14 |

OTHER PUBLICATIONS

Habitz et al., U.S. Appl. No. 12/108,629, Office Action Communication, Mar. 26, 2010, 5 pages.
Habitz et al., U.S. Appl. No. 12/108,629, Notice of Allowance, Jun. 18, 2010.

* cited by examiner

*Primary Examiner*—Stacy A Whitmore
(74) *Attorney, Agent, or Firm*—Gibb I.P. Law Firm, LLC; Richard M. Kotulak, Esq.

(57) ABSTRACT

A method and service of balancing delay in a circuit design begins with nodes that are to be connected together by a wiring design, or by being supplied with an initial wiring design that is to be altered. The wiring design will have many wiring paths, such as a first wiring path, a second wiring path, etc. Two or more of the wiring paths are designed to have matching timing, such that the time needed for a signal to travel along the first wiring path is about the same time needed for a signal to travel along the second wiring path, the third path, etc. The method/service designs one or all of the wiring paths to make the paths traverse wire segments of about the same length and orientation, within each wiring level that the first wiring path and the second wiring path traverse. Also, this process makes the first wiring path and the second wiring path traverse the wire segments in the same order, within each wiring level that the first wiring path and the second wiring path traverse.

13 Claims, 7 Drawing Sheets

METHOD OF GENERATING WIRING ROUTES WITH MATCHING DELAY IN THE PRESENCE OF PROCESS VARIATION

CROSS-REFERENCE TO RELATED APPLICATIONS

This application is a Continuation of U.S. application Ser. No. 10/908,102 filed Apr. 27, 2005, the complete disclosure of which, in its entirety, is herein incorporated by reference.

BACKGROUND OF THE INVENTION

1. Field of the Invention

The present invention provides a method of balancing delay in a circuit design that modifies one or all of the wiring paths to make the paths traverse wire segments of about the same length and orientation, within each wiring level that the paths traverse, and to traverse such segments in the same order.

2. Description of the Related Art

A significant source of delay variation in paths on an integrated circuit is variation (due predominantly to variations in the manufacturing process) of characteristics, such as height, width, and spacing, of the metal wires used to interconnect the circuit elements of the integrated circuit. These interconnecting wires are typically composed of segments on multiple wiring layers (a net is a collection of connected net segments which forms a connection between two or more circuit elements). To maximize the usability of the available space on these wiring layers and to reduce the tendency for one wire segment to block the desired path of another wire segment on the same wiring layer, wire segments on one layer are typically oriented solely or predominantly in a single direction (e.g., all horizontal or all vertical). Wire segments on adjacent layers are typically oriented in different directions, usually perpendicular to each other. Therefore, to create a wiring connection between two points which are neither horizontally nor vertically aligned, a pair of wire segments on two wiring layers is generally used, with a via, or interlayer connection, used to connect the layers at the "bend" in the wiring route. Multiple horizontal and vertical segments may also be used in such connections by introducing additional "bends" in the wiring route, although there may be benefit in yield, and other respects, in reducing the number of such bends. Other sets of wiring directions are sometimes used, so that some wiring layers may be preferentially used for wire segments oriented at a 30, 60, or 45 degree angle to the predominant wire segment direction on some other wiring layer.

The above-mentioned wire characteristics whose variation results in delay variation tend to be well-correlated among different wire segments on the same wiring layer because these different wire segments are manufactured together during the same set of manufacturing steps. However wire characteristics of wire segments on different wiring levels tend to be very poorly correlated, because they are created during different sets of manufacturing steps. These variations in the characteristics of wire segments on a particular wiring layer will normally cause variations in electrical parameters of wire segments on that layer, and in particular in their resistance and capacitance. Wire variations which increase wire resistance, such as reductions in wire width or thickness, will often cause decreases in wire capacitance, and vice versa. The source to sink delay of a multiple wire segment net will increase with increases in both wire segment capacitance and resistance. But an increase in resistance in a wire segment near a net source will cause a larger delay increase than a similar resistance increase in a wire segment near the net sink, because more of the net capacitance must be charged or discharged through that wire segment resistance when a signal transition occurs. Similarly, an increase in the capacitance of a wire segment near a net sink will cause a larger delay increase than a similar capacitance increase in a wire segment near the net source, because the current which charges or discharges the wire segment capacitance must pass through more of the net resistance when a signal transition occurs.

Thus nets which have wire segments on different wiring layers, have different length wire segments on the same wiring layers, or have wire segments of the same lengths on the same wiring levels, but in different orders, will exhibit different delay variations. As an example, consider the delay of two nets, each with a 1 mm segment of M5 (metal on level 5), a 1 mm segment of M6, and a sink capacitance of 100 fF, and where both metal levels have a nominal resistance of 100 ohms per mm and a nominal capacitance of 1 pF per mm. In the first net the M5 segment precedes (is closer to the net source than) the M6 segment, and in the second net the M6 segment precedes the M5 segment. According to the well-known Elmore delay approximation, if R1 and R2 are the resistances of the first and second wire segments, respectively, C1 and C2 are the capacitances of the first and second wire segments, respectively, and Cl is the load capacitance, the net delay will be $$D=R1*(C1/2+C2+Cl)+R2*(C2/2+Cl).$$

With the values given above, both nominal net delays is (in seconds)

$$D\text{nom}=1E2*(1E\text{-}12/2+1E\text{-}12+1E\text{-}13)+1E2*(1E\text{-}12/2+1E\text{-}13), \text{ or}$$

$$D\text{nom}=220 \text{ ps.}$$

If, however, some process variation causes the M5 resistance to increase by 10%, the M5 capacitance to decrease by 10%, the M6 resistance to decrease by 10%, and the M6 capacitance to increase by 10%, the first net delay would become:

$$D\text{var1}=1.1E2*(9E\text{-}13/2+1.1E\text{-}12+1E\text{-}13)+9E*(1.1E\text{-}12/2+1E\text{-}13), \text{ or}$$

$$D\text{var1}=240 \text{ ps, and}$$

$$D\text{var2}=9E1*(1.1E\text{-}12/2+9E\text{-}13+1E\text{-}13)+1.1E2*(9E\text{-}13/2+1E\text{-}13), \text{ or}$$

$$D\text{var2}=200 \text{ ps.}$$

Thus nets with matching delays under nominal conditions can result in significantly different delays under process variation (+/−9% for 10% parameter variations, in this example). Although the above delay estimations were performed using the Elmore delay formula for simplicity, similar results are obtained using more accurate methods such as moment matching or circuit simulation. The fundamental issue is that the even if the delay functions for two nets match at a particular point, unless net characteristics such as the levels orders and lengths of wire segments are matched, they may have different sensitivities to or derivatives with respect to various process parameters, and thus different delays in the presence of process variation.

Correct operation of a digital integrated circuit requires that set up and hold tests between clock and data signals at latches and flip-flops in the integrated circuit be satisfied, or more generally, that specific ordering relationships (hereafter referred to collectively as timing tests) between the arrival times of various pairs of signals within the integrated circuit be satisfied. The signal arrival times involved in these timing tests are functions of the delays of various nets and circuit elements along the paths or signal fanin cones. A signal fanin cone is the collection of circuit elements, all of whose outputs directly or indirectly feed the signal. The delays of these circuit elements and nets are themselves functions of many parameters, including wire characteristics whose variation was described above. To ensure that timing tests are satisfied in the presence of process variation, it is important that the variation in the difference between the delays of the two paths involved in the test be minimized. Typically both paths or cones involved in a timing test include a clock delay portion, in one case to the clock pin of the latch or flip-flop from which data signals are launched, and in the other case to the clock pin of the latch or flip-flop at which data signals are captured, and at which the timing test is performed. Since a latch or flip-flop will be involved in both launching and capturing data, and may be involved in both critical setup and hold tests, the clock delay portion will generally have both upper bounds and lower bounds imposed by timing tests. A good way to improve the probability of passing timing tests in the presence of process variation is to try to minimize the variation in the difference in delay between all pairs of launch and capture clock paths involved in critical (close to failing) timing tests.

One common method of minimizing the differences in delay and delay variation is by the use of H-trees, as shown in FIG. 1. More specifically, FIG. 1 shows balanced H-trees which extend from R. Nodes labeled 1 form a first level H-tree and nodes labeled 2 form four second level H-trees connected to ends of the first level H-tree. But such tress may not be possible to construct if there are blockages, and may waste wiring resource and power if the distribution of clock sinks (e.g., latches or flip-flops) is spatially not uniform.

Another method of balancing (minimizing the differences in) the delay of paths is described in U.S. Pat. No. 5,339,253 by Carrig et al., in "Exact zero skew", Ren-Song Tsay, ICCAD 1991, pp. 336-339, and in "Zero skew clock routing with minimum wirelength" by Ting-Hai Chao et al. in IEEE Transactions on Circuits and Systems II, November 1992, pp. 799-814, which are incorporated herein by reference. These methods build a distribution tree to a set of sinks with relative arrival time targets by iteratively pairing sinks, connecting them, and determining a point along the wire interconnecting them from which to drive the pair such that the relative arrival time targets for the sinks are met (i.e., that the difference in delays from the driving point to the sinks equals the difference in the target arrival times of the sinks). This drive point then becomes a sink for a successive iteration of the method, with a target arrival time equal to the target arrival time of either sink minus the delay from the drive point to that sink. The criteria for pairing sinks generally attempts to minimize the maximum distance between the sinks of any pair, and/or to minimize the total wire length used to connect all pairs. These methods are able to adapt to blockages and nonuniform sink distributions, but do not address reducing variation in delay differences in the presence of parameter variation.

A related conventional method is described in "Optimal buffered clock tree synthesis" by Jae Chung et al. in the 1994 IEEE International ASIC Conference and Exhibit, pp. 130-133, which attempts to minimize the sensitivity of the net delay to process variation by choosing a wire width which makes the derivative of delay with respect to width equal to zero. However this may require a wire width which is not practical to implement, and does not directly address the variation in the difference between pairs of net delays. It also eliminates delay variation only in the neighborhood around the ideal chosen point, and hence a large variation in wire segment parameters, which can happen in practice, may still cause a significant variation in delay.

SUMMARY OF THE INVENTION

The present invention provides a method and service of balancing delay in a circuit design. The invention begins with nodes that are to be connected together by a wiring design, or by being supplied with an initial wiring design that is to be altered. The wiring design will have many wiring paths, such as a first wiring path, a second wiring path, etc. Two or more of the wiring paths are designed to have matching timing, such that the time needed for a signal to travel along the first wiring path is about the same time needed for a signal to travel along the second wiring path, the third path, etc. The invention designs one or all of the wiring paths to make the paths traverse wire segments of about the same length and orientation, within each wiring level that the first wiring path and the second wiring path traverse. Also, this process makes the first wiring path and the second wiring path traverse the wire segments in the same order, within in each wiring level that the first wiring path and the second wiring path traverse.

Thus, the invention makes the first wiring path and the second wiring path traverse the same lengths of horizontal wiring segments and the same lengths of vertical wiring segments and makes the first wiring path and the second wiring path traverse the horizontal wiring segments and the vertical wiring segments in the same order. The order of vertical and horizontal line segments that make up the first wiring path and the second wiring path is selected to avoid blockages and minimize average congestion along the first wiring path and the second wiring path.

The invention can also match the delay sensitivity signature of horizontal segment lengths of the first wiring path to the delay sensitivity signature of horizontal segment lengths of the second wiring path, and similarly match the delay sensitivity signature of vertical segment lengths of the first wiring paths to the delay sensitivity signature of vertical segment lengths of the second wiring path.

This process lengthens one of the wiring paths to match the approximate length of the other wiring path. This can be done by observing which path has the longest length of vertical and horizontal paths and then lengthening the shorter path(s) to meet the length of the longest path. Alternatively, the process can compare the straight line distance (e.g., the distance along specified wiring directions which may include 30, 45, 60 degree lines or other lines) between the beginning of the first wiring path and an end of the first wiring path with the straight line distance between the beginning of the other wiring path (s) and an end of the other wiring path(s). Then this process creates one of the wiring paths (using horizontal and vertical sections) for the wiring path that had the longest straight line distance and then creates the other wiring path(s) to match the horizontal and vertical sections of the longest wiring path.

Thus, one idea of the invention is to create routes for two or more source (beginning) to sink (end) wiring paths such that the paths traverse wire segments of similar lengths on the same wiring levels and in the same order, in order to reduce the difference between the delays of the two wiring paths in the presence of process variation which may alter the characteristics of the wire segments from their nominal values.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
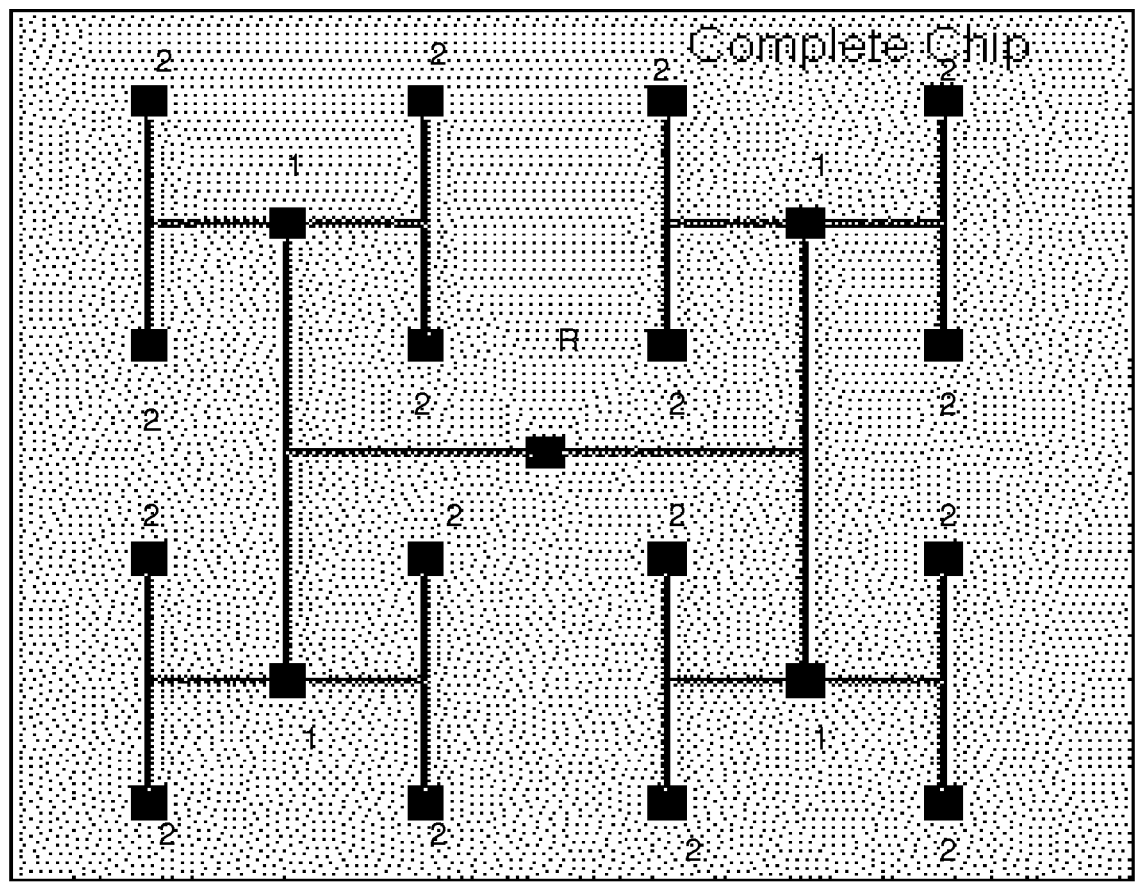
FIG. 1 is a schematic diagram of a conventional H-tree wiring pattern on an integrated circuit chip.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

In the descriptions below it should be understood that collections of horizontal, or X axis distances and wire segments and vertical, or Y axis distances and wire segments may be extended to include distances and wiring segments in other preferred wiring directions, such as at 45 degree angles to the chip edges. In all cases the decomposition can be extended to include distances in other wiring directions for 45 degree and other wiring methods. The steps in the following methods in which a path is broken up into horizontal and vertical segments which collectively span the source to sink distance would then be replaced by steps which break the path into segments in the preferred wiring directions for the wiring layer on which the balanced routes are to be routed.

Figure 2:
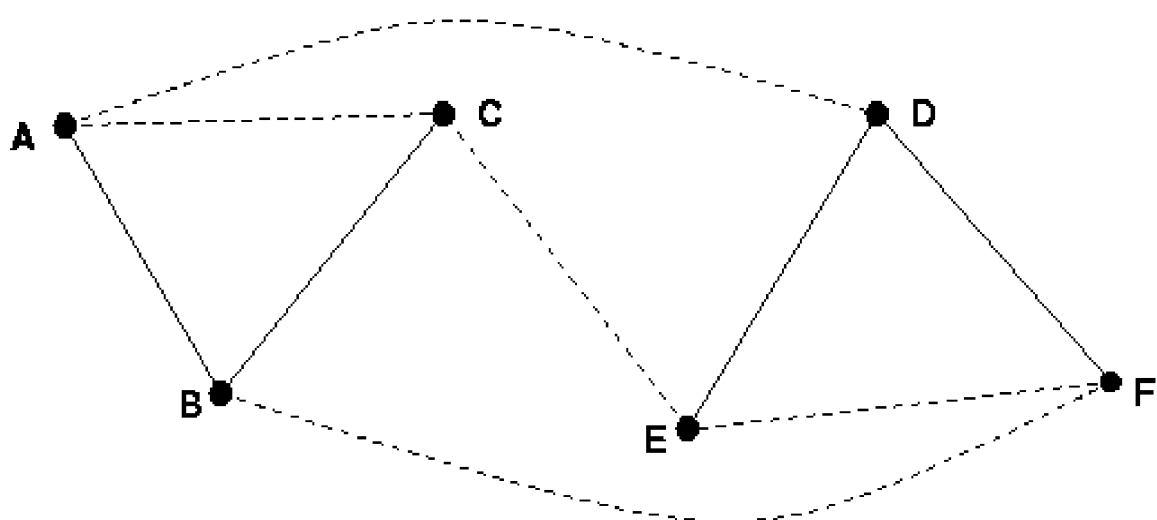
FIG. 2 is a schematic diagram of critical and non-critical paths between clocked memory elements A-F.

Also in of the descriptions below, it should be understood that the set of wiring paths to be matched can be all sinks of a clock tree or all with slack less than some threshold. They may also be selected sets of sinks of a clock determined based on latch graph, which has a node for each latch or clock tree sink and an edge between the nodes for any latches which have at least one data path between them, with a slack being computable on these edges based on the tightest timing constraint on any data path between the latches. From the latch graph one might consider together (created matched wiring routes for the clocks feeding) each set of clock tree sinks in a sub graph whose nodes are connected (transitively) by latch graph edges with a slack less than some specified threshold. FIG. 2 shows a latch graph with latches A-F, where solid lines represent critical edges and dashed lines represent noncritical edges. In this case two clusters (sets of latches whose wiring routes are to be matched) is generated, one containing A, B, and C, and another containing D, E, and F.

Also in the descriptions below, two distances or wire segment lengths may be considered to be equal if they are exactly equal, or may be considered to be equal if their lengths are within some specified tolerance. Segments or distances may also be considered to be equal based on some variable tolerance. Such a tolerance might be tighter for paths considered more critical (with lower slack). It might also depend on the estimated impact of the length difference on delay, e.g., by computing the well-known Elmore delay estimate for the paths and determining the sensitivity of the delay to the length mismatch. Or a variable tolerance could employ a combination of these and other criteria.

Also in all of the descriptions below, sink loads are matched as closely as is practical, since the delay sensitivity to changes in wiring parameters will be affected by the sink load. Other sources of variation are avoided, such as noise coupling from adjacent switching wires, which could speed up some of the delays to be matched and slow down others as a result of different direction transitions on the nets to which they are coupled. A common way to eliminate coupling is to route a wire X (whose delay variation is to be controlled) adjacent to wires which are known not to be switching when wire X is doing so. Such wires are commonly ground or power supply wires, but may also be test clocks which do not operate when the functional clock (of which wire X may be a part) is running, or other wires known (typically through static timing analysis) to switch only at times when X is not.

The sources and sinks of paths to be matched should be placed so that the horizontal source to sink distances match as closely as possible, and so that the vertical source to sink distances match as closely as possible. This could be done in a bottom up tree generation by placing driving buffers at similar horizontal and vertical distances from the latches or other sinks they drive, in a top down tree generation by placing sinks at similar distances from their sources, or by some combination of these. This would increase the likelihood that subsequent conventional routing methods would produce balanced routes. It would also reduce the amount of unnecessary wiring required by subsequent embodiments to produce matched routes.

Thus, the present invention provides a method of balancing delay in a circuit design. The invention can be utilized to create a wiring design or can be utilized to modify a preexisting wiring design. Therefore, the invention begins with a set of nodes that are to be connected or begins making (or being supplied with) an initial wiring design. This wiring design will have many wiring paths, such as a first wiring path, a second wiring path, etc. Two or more of the wiring paths are designed to have matching timing, such that the time needed for a signal to travel along the first wiring path is about the same time (within some predetermined tolerance limit) needed for a signal to travel along the second wiring path, the third path, etc. The invention creates or modifies one or more of the wiring paths to make the paths traverse wire segments of about the same length and orientation, within each wiring level that the first wiring path and the second wiring path traverse. Also, this process makes the first wiring path and the second wiring path traverse the wire segments in the same order, within each wiring level of the integrated circuit chip design that the first wiring path and the second wiring path traverse.

A particular implementation of the invention begins by performing the exact zero skew method described in the background section. However, with the invention, when selecting pairs of sinks to be connected to the same branch of the tree, the objective is to minimize the maximum horizontal distance and the maximum vertical distance between any pairs of sinks within the set whose routes are being matched. In contrast, the conventional methods would typically pair sinks with the objective of minimizing either the maximum total (horizontal plus vertical) distance between the sinks of any pair, the sum of such total distances across all pairs, or some combination of these.

The invention can also match the delay sensitivity signature of horizontal segment lengths of the first wiring path to the delay sensitivity signature of horizontal segment lengths of the second wiring path, and similarly match the delay sensitivity signature of vertical segment lengths of the first wiring paths to the delay sensitivity signature of vertical segment lengths of the second wiring path. With this aspect of the invention, at least two routing options are generated (e.g., through a standard routing program) for at least one source to sink path among a set of such paths to be matched, and at least one routing option is generated for all remaining source to sink paths in the set. A delay sensitivity signature is computed for all of the routing options generated, which estimates the sensitivity of the delay of that route to each of the wire layer parameters subject to process variation. For each source to sink pair, a routing option is chosen from among those generated such that the delay sensitivity signatures of all chosen routing options are as similar as possible. A delay sensitivity signature can comprise derivatives of the delay with respect to each of the sources of variation. Such derivatives might be computed analytically, using an analytic delay formula such as the well-known Elmore delay model, through finite differencing, or by other means. Similarity between a pair of delay sensitivity signatures for paths A and B with M variation parameters might be determined by computing the sum of the absolute values of the differences between corresponding derivative components, e.g., |dDelayA/dParameter1−dDelayB/dParameter1|+|dDelayA/dParameter2−dDelayB/dParameter2|+ . . . |dDelayA/dParameterM−dDelayB/dParameterM|, with a smaller sum indicating a higher degree of similarity. Other means of determining a similarity measure, such as summing the squares of these differences rather than their absolute values, might also be used.

Figure 4:
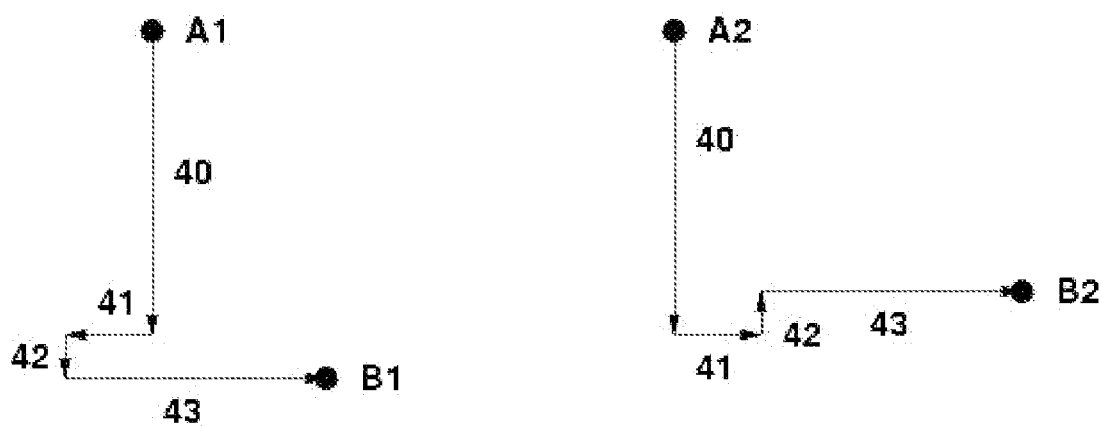
Figure 5:
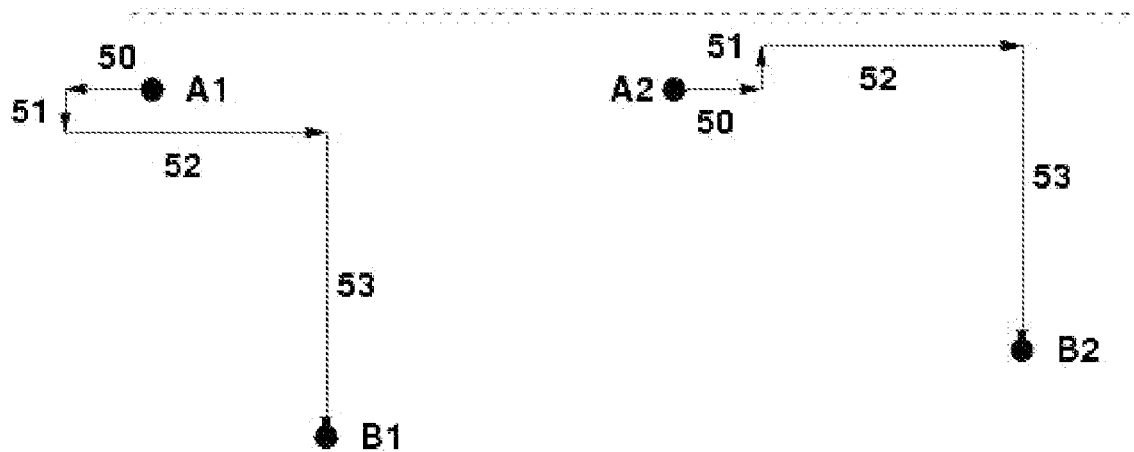

As mentioned above, the invention can match the wiring routes for two source to sink wiring paths to be routed, with horizontal source to sink distances x1 and x2, respectively, vertical source to sink distances y1 and y2, respectively. The invention determines two horizontal segment lengths min(x1, x2)+|x1−x2|/2 and |x1−x2|/2, and two vertical segment lengths min (y1, y2)+|y1−y2|/2 and |y1−y2|/2. The first of the horizontal and vertical segment lengths determined would go in the same direction for both routes, while the second of the horizontal and vertical segment lengths determined would continue in that same direction for the route with the longer source to sink distance, and would reverse direction for the other route. Thus, the sum of the two horizontal (vertical) segment lengths would equal the longer horizontal (vertical) source to sink distance, and their difference would equal the shorter horizontal (vertical) source to sink distance. Any ordering of these four segments could then be chosen to implement the two routes, with the requirement that the ordering be the same for each. If an ordering is chosen in which two horizontal or two vertical segments are adjacent, a small jog in the perpendicular direction can be introduced so that the route which reverses direction does not have these two segments occupying the same wiring track. The choice of order is arbitrary, and may be made to avoid blockage on one or both routes, to minimize maximum or average congestion on one or both routes. Also note that when |x1−x2| is less than some threshold, only one horizontal segment is required, and similarly, when |y1−y2| is less than some threshold, only one vertical segment is required. The FIGS. 3-5 show three alternative orderings sets of the same four segment lengths implementing two source to sink paths.

Figure 3:
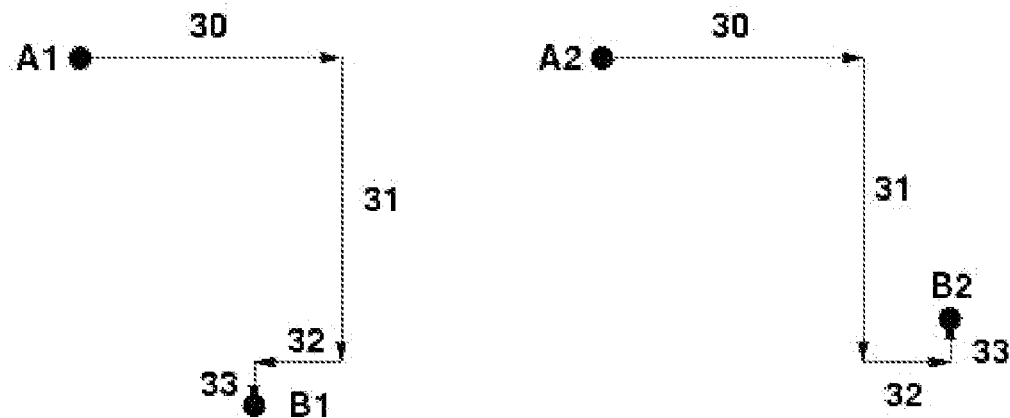
FIG. 3-5 are schematic diagrams of pairs of wiring patterns having balanced signal delay properties.

More specifically, FIG. 3 illustrates a wiring path connecting point A1 with B1, and another wiring path connecting point A2 with B2. Both wiring paths include a first horizontal segment 30, a vertical segment 31, a horizontal segment 32, and a vertical segment 33. Each of the horizontal and vertical segments are of about the same length and are in the same horizontal/vertical order in each wiring path. Similarly, FIG. 4 illustrates an alternative pair of wiring paths connecting A1 with B1 and connecting A2, with B2 with matching horizontal and vertical wiring paths 40-43, and FIG. 5 illustrates another pair of alternative wiring paths with matching horizontal and vertical wiring paths 50-53. Note that in each of the wiring paths shown in FIGS. 3-5, the first wiring path and the second wiring path traverse the same lengths of horizontal wiring segments (even numbers) and the same lengths of vertical wiring segments (odd numbers) in the same order. Also note that the horizontal and vertical wire segment lengths in FIGS. 3-5 are the same, but arranged in a different order in each figure. Thus horizontal segments 30 which appear first in the wiring paths of FIG. 3 are the same length as horizontal segments 43 which appear last in the wiring paths of FIG. 4, and are also the same length as horizontal segments 52 which appear third in the wiring paths of FIG. 5. Similarly, vertical segments 31, 40, and 53 are the same length, horizontal segments 32, 41, and 50 are the same length, and vertical segments 33, 42, and 51 are the same length. Thus FIGS. 3-5 are alternative pairs of equal length wiring paths connecting A1 with B1 and A2 with B2, differing only in the ordering of their wire segments.

This invention may be generalized to handle N source to sink pairs with horizontal source to sink distances x1 . . . xN and vertical source to sink distances y1 . . . yN. In general this is done by determining K horizontal segment lengths, such that there exists for each source/sink horizontal distance, an assignment of signs (+/−) such that when the segment lengths are added with these signs, their sum equals the source/sink horizontal distance. To minimize wiring resources required the sum of all these segment lengths should equal the maximum source to sink horizontal distance (i.e., the +/− assignments for the source to sink pair with the maximum horizontal distance will all be the same). A similar procedure is followed to determine a set of vertical segment lengths.

One specific method to determine such a segment set and sign assignment for N source to sink pairs is to first sort the source to sink distances of all pairs, such that x1<x2< . . . xK. Any distances that are equal (possibly within a specified tolerance) are considered together, so K (the number of distinct source to sink distances) may be less than N. A first segment length of (x2+x1)/2 (equal to min(x1, x2)+|x1−x2|/2 as used in determining segments for pairs of routes above) is then determined, oriented from the source toward the sink for all pairs, and the endpoint of these segments become the new source points, with the distances from each of them to their corresponding sinks being the new source to sink spacings for the pairs (i.e., update the source to sink distance for each pair to the absolute value of the difference between the previous pair source to sink distance and the segment length just determined). Note that after this first segment length has been determined and the source points for all source to sink pairs adjusted, the new distances for pairs 1 and 2 (which had old distances x1 and x2) will be equal at (x2−x1)/2, and thus the number of distinct source to sink distances will be reduced by (at least) one. This step is repeated until all source to sink pairs have the same remaining distance, and that distance is used as the final horizontal segment. Since the number of distinct source to sink distances is reduced by (at least) one in each step, the total number of horizontal segments required is <=N. A set of vertical segments is determined in a similar manner. These determined horizontal and vertical segments can then be implemented in any order, as long as the same order is used for all source to sink pairs. The choice of order is arbitrary, and may be made to avoid blockage on one or all routes, to minimize maximum or average congestion on one or all routes. Thus, the invention makes the first wiring path, the second wiring path, and all of the remaining N wiring paths traverse the same lengths of horizontal wiring segments and the same lengths of vertical wiring segments and makes all of the N wiring path traverse the horizontal wiring segments and the vertical wiring segments in the same order. The order of vertical and horizontal line segments that make up each of the N wiring paths is selected to avoid blockages and minimize average congestion along all of the N wiring paths.

Figure 6:
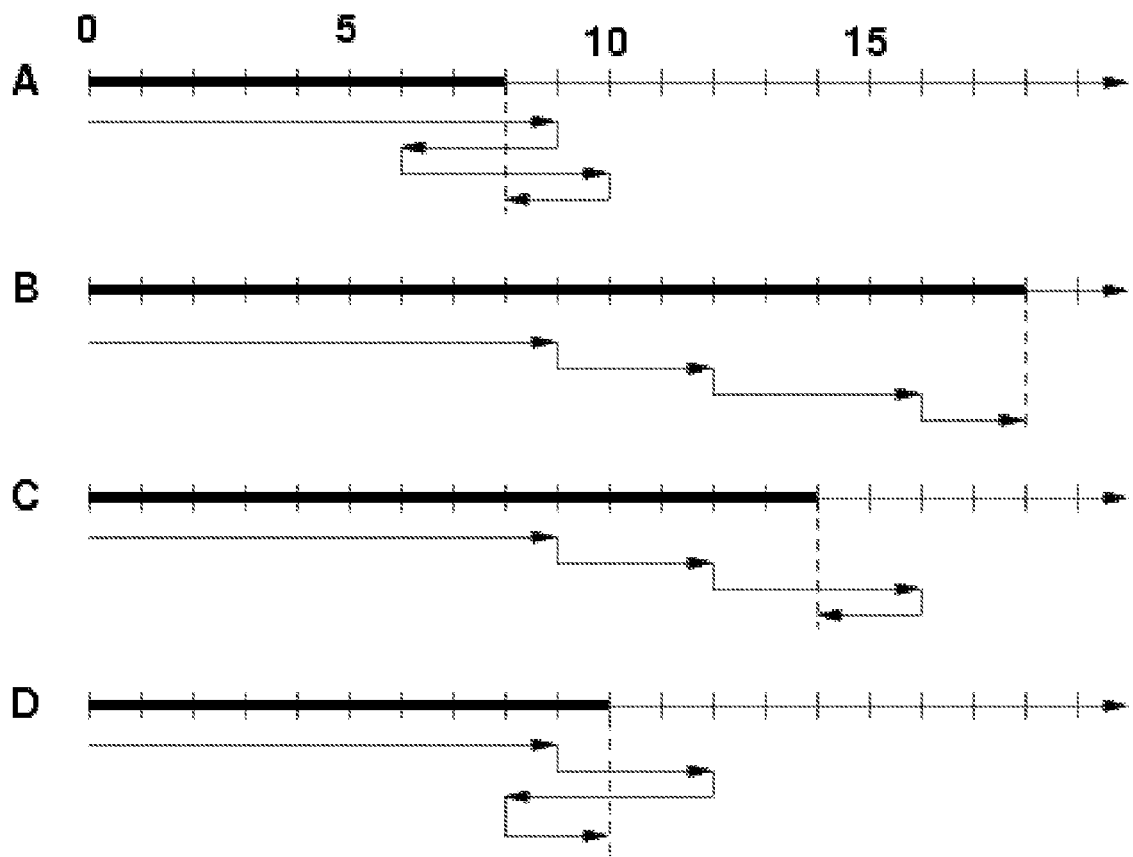
FIG. 6 is a schematic diagram of the same length of wiring pattern consuming different amounts of linear space in examples A-D.

As an example, consider four source to sink paths A, B, C, and D, with distances in a particular direction (e.g., horizontally) of 8, 18, 14, and 10 as shown in FIG. 6. The invention first sorts them and determines that A and D have the smallest distances of 8 and 10, and therefore creates a first segment of length (8+10)/2=9. After subtracting this segment length from each distance this produces adjusted distances of −1, 9, 5, and 1. The invention retains the sign here as it indicates that the next segment for this source to sink path will be in the reverse direction, although only the absolute values of the distances are used when re-sorting the distances and computing the next segment length, so the distances of 1 and −1 are considered equivalent. The smallest two distances are now 1 and 5, so the next segment length is (1+5)/2=3. Subtracting this again from all the source to sink distances gives new adjusted source to sink distances of 2, 6, 2, and −2. The first distance is 2 because we took the previous signed distance and added a segment of length 3 in the opposite direction, i.e., −1+3=2. The only two remaining distances are 2 and 6, so the next segment length is (2+6)/2=4, and the adjusted distances become −2, 2, −2, and 2. Since all distances are now 2, the final segment has length 2. Thus the combinations of segment lengths and signs which constitute each of the paths are:

$A=9-3+4-2=8$ $B=9+3+4+2=18$ $C=9+3+4-2=14$ $D=9+3-4+2=10$

The plus segments go in one direction (from the source toward the sink) and the minus segments go in the opposite direction, as illustrated in FIG. 6. A similar decomposition is done independently in the other direction. Note that the sum of the segment lengths exactly equals the largest source to sink path distance, which is the minimum amount of wire in this direction which can be used and still achieve matched routes.

Note that if blockages prevent any ordering of a set of determined segment lengths from being implemented for all source to sink paths, this may increase the total distance (sum of segment lengths) beyond the maximum source to sink distance, in order to allow enough wire to route around the obstacle. One way to accomplish this is to simply add an initial segment in one or both wiring directions which is oriented from the source away from the sink for all of the source to sink paths. This initial segment may be reordered along with all other segments computed as described above.

To reduce the total number of segments required for each route, any pairs of segments which are of the same length, on the same layer, and go in the same direction in each net to be matched may be combined into a single segment in each net. For example, consider matching routes for nets X, Y, Z, and W, where nets X and Y have horizontal segment of lengths 3 and 4, both going from right to left, and nets Z and W both have horizontal segment of lengths 3 and 4, both going from left to right. These length 3 and 4 segments may be combined into a length 7 segment in each net, with these combined segments going from right to left in nets X and Y and going from left to right in nets Z and W.

Figure 7:
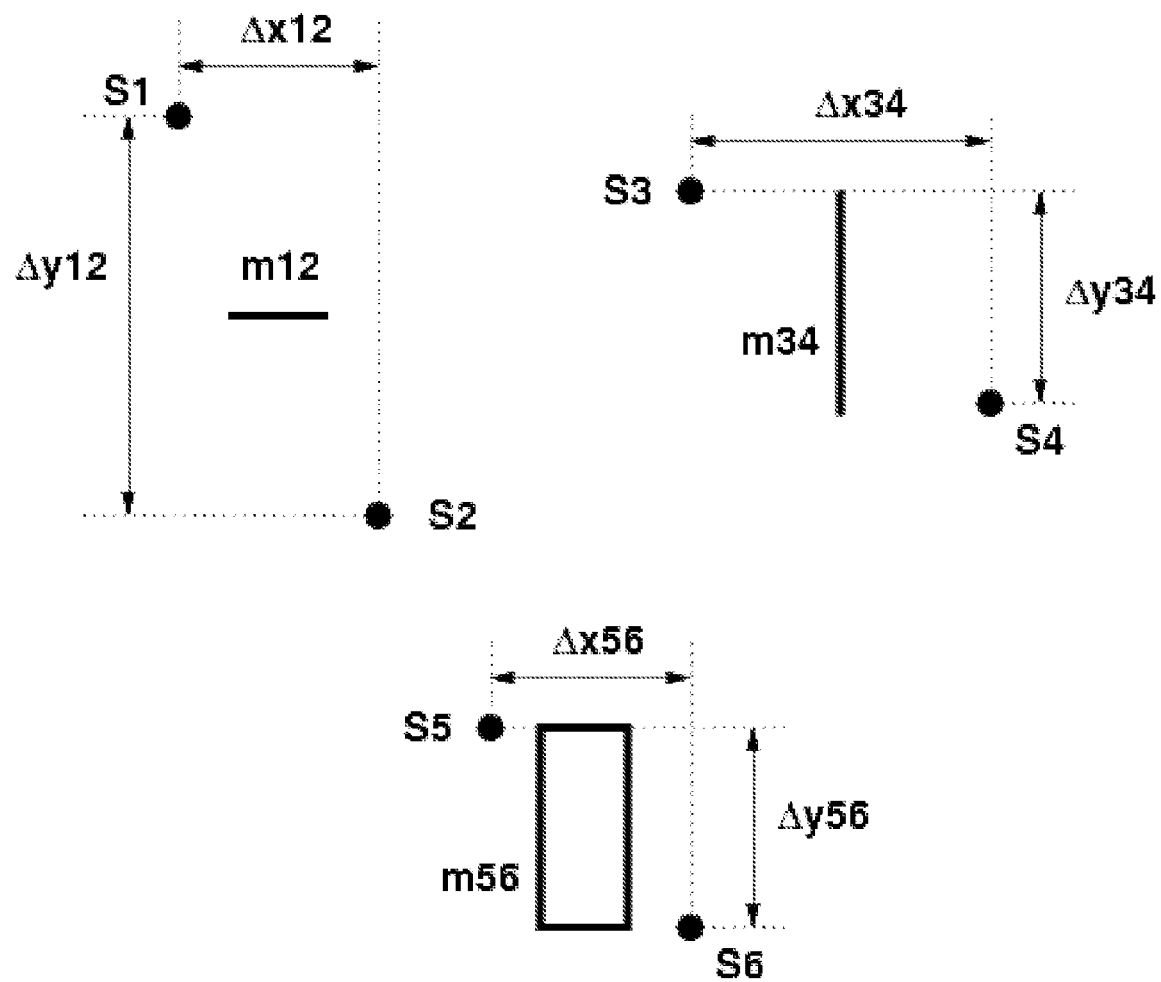
FIG. 7 is a schematic diagram of distance measures between different pairs of nodes and of a series of wire segments which may be used to span those distances.

In one embodiment whose operation is shown in the example of shown in FIG. 7, the invention starts with a set of pairings of sinks S1-S6, as in the exact zero skew algorithm described in the background (these pairings might have been chosen according to the description in the second part of the first invention). In this example sink S1 is paired with S2, S3 with S4, and S5 with S6. Among all such pairs whose wiring routes are to be matched, we determine the maximum x distance delta_x ($\Delta$x) and y distance delta_y($\Delta$y). In FIG. 7 the maximum $\Delta$x is $\Delta$x34 and the maximum $\Delta$y is $\Delta$y12. For each pair of sinks with coordinates (x1,y1) and (x2,y2), where without generality we assume x1<x2 and y1<y2, we then determine a merge region (similar to that described in the deferred merge embedding conventional) which extends horizontally from x2−delta_x/2 to x1+delta_x/2. Similarly, the vertical extent of the merge region is from y2−delta_y/2 to y1+delta_y/2. Note that for the pair with the maximum horizontal spacing (the pair which determines delta_x) only one x coordinate for the merge region is allowed, so the merge region is a vertical line, and similarly with the allowed y coordinate of the merge region for the pair with the maximum vertical spacing, in which case the merge region is a horizontal line. For all pairs which have neither the maximum $\Delta$x or $\Delta$y the merge region is a rectangle. The merge regions for the pairs in FIG. 7 are m12, m34, and m56. The invention can then route from any point within the allowed merge region for each pair to each sink of the pair using exactly delta_x/2 horizontal wire and delta_y/2 vertical wire. For example, the general method of the invention discussed above may be used to determine a set of wire segments which meet this constraint.

The exact merge point for each pair (the point from which routes to each sink of the pair are routed) is not determined until after the pairing of sinks at upper levels of the tree have been determined. In particular, the pairing of merge regions might be done (as in the second part of invention 1) so that the maximum delta_x and maximum delta_y values of any pair in the set to be matched are minimized. The pair which determines the delta_x will be said to have the maximum required horizontal spacing, and the pair which determines the delta_y will be said to have the maximum required vertical spacing. The merge point for a pair of sinks itself becomes a sink at a higher level of the distribution network (i.e., a level closer to the root of the distribution tree), and the locations of these higher level sinks are allowed to move within their determined merge regions. That is, if a particular higher level sink with a range of allowed x coordinates from x1,A to x1,B is paired with another higher level sink with a range of allowed x coordinates from x2,A to x2,B, the delta_x associate with the pair is the minimum |x1<x2| such that x1,A<=x1<=x1,B and x2,A<=x2<=x2,B. The y coordinate of the higher level sinks is determined in a similar manner. So the merge regions are determined bottom up, and the exact merge points are chosen top down. For each pair, any x and y coordinates can be chosen for the final merge point as long as they are within the determined merge region of the pair, and they do not cause the delta_x or delta_y for the pair to exceed the value of the pair with the maximum required spacing.

Figure 8:
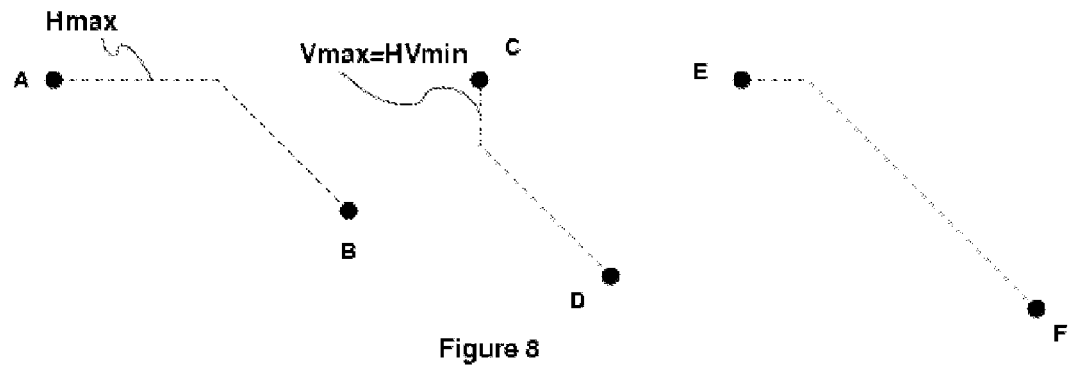
FIGS. 8-11 are schematic diagrams of steps in the construction of a pair of wiring patterns having balanced signal delay properties.

In another embodiment a determination is first made, for each route i of a set of routes to be balanced, of the shortest path that connects the endpoints of that route using only horizontal, vertical, and 45 degree lines. The length of this path may be considered the straight line distance of path i in this context. Such routes may always be composed of a single diagonal portion Di and either a horizontal portion Hi or a vertical portion Vi. For a route whose shortest path has a vertical portion and a diagonal portion, Hi will be zero (which is shown, for example, between nodes C and D in FIG. 8). Similarly, for a route whose shortest path has a horizontal portion and a diagonal portion, Vi will be zero (which is shown, for example, between nodes A and B and between nodes E and F in FIG. 8). In general any or all of Di, Vi, and Hi may be zero, however at least one of Hi and Vi must be zero for each route. The longest horizontal portion Hmax of any of these paths is determined, and longest vertical Vmax portion of any of these paths is also determined, as shown between nodes A and B and nodes C and D in FIG. 8. The minimum HVmin of Hmax and Vmax is then determined. As shown in FIG. 8, this occurs between nodes C and D.

Figure 9:
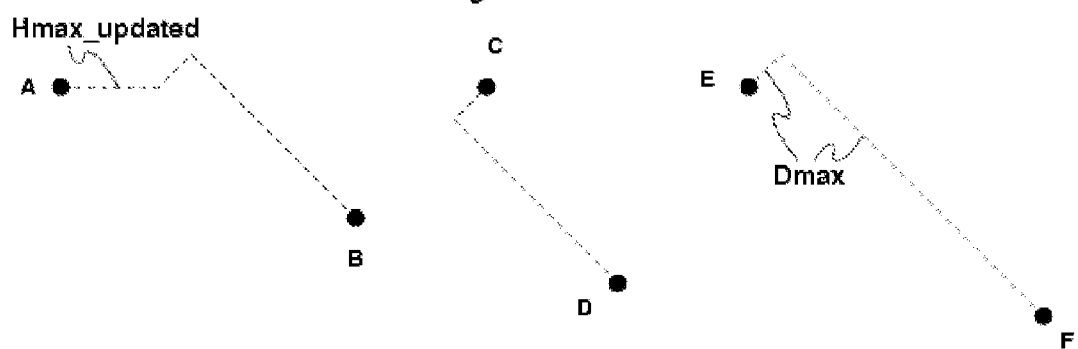

The horizontal or vertical portion of each route is then reduced by up to HVmin, so that Hi_reduced=max(0, Hi−HVmin) and Vi_reduced=max(0, Vi−HVmin). If the amount by which the horizontal or vertical portion of route i was reduced is HVreduction=min(HVmin, max(Hi, Vi)), the diagonal portion of each route is then increased by square_root(2)*HVreduction. The effect of these changes is to make the Vi portions zero for all routes or to make the Hi segments zero for all routes, and to replace the removed horizontal segments by an increase in the diagonal portion which would be equal to the legs of an isosceles right triangle having the removed horizontal or vertical portion as its hypotenuse, as shown in FIG. 9 for each of the nodes A-B, C-D, and E-F. The maximum diagonal portion Dmax is then determined (between nodes E and F in FIG. 10), as is an updated maximum horizontal portion Hmax_updated and a maximum vertical portion Vmax_updated. Note that either Vmax_updated or Hmax_updated must be zero as a result of the preceding steps.

Figure 10:
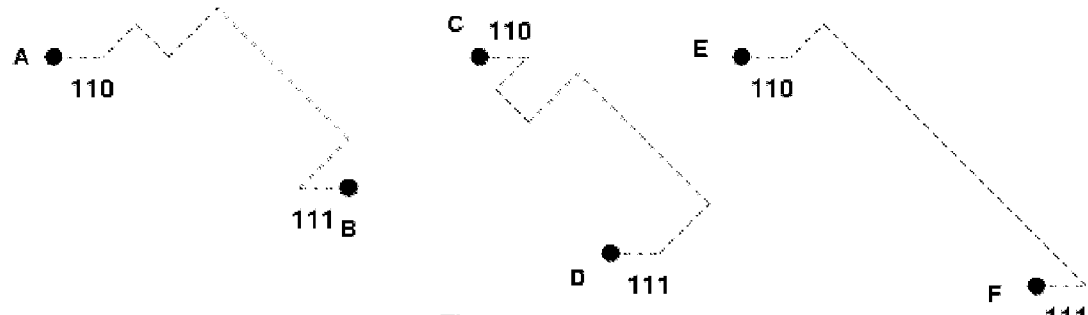

A path for each route is then constructed using diagonal segments of length Dmax and either horizontal segments totaling length Hmax_updated or vertical segments totaling length Vmax_updated, as shown in FIG. 10. For example, the total length of segments 110 and 111 is equal to the length Hmax_updated in FIG. 9. The remaining diagonal segments can be completed in many ways as shown between nodes A-B, C-D, and E-F in FIG. 10. This will always be possible using the following operations. An original diagonal segment which is the hypotenuse of an isosceles right triangle may be replaced by the diagonal legs of that triangle.

While the total length of segments 110 and 111 is shown as being equal to the length Hmax_updated in FIG. 9, a horizontal length Hincrease or a vertical length Vincrease may be added by breaking a route at any two points and moving the portion of the path between the break points up or down by Vincrease/2 or moving it right or left by Hincrease/2, and then connecting the now separated ends at the break points. Similarly, a diagonal length Dincrease may be added by breaking a route at two points and moving the portion of the path between the break points diagonally up right, up left, down right, or down left by Dincrease/2 and then connecting the now separated ends at the break points. In this manner the diagonal length of each path is increased to equal Dmax, and the horizontal or vertical length of each path is increased to match Hmax_updated or Vmax_updated, thus achieving a route for each path using diagonal segments of length Dmax and either horizontal segments totaling length Hmax_updated or vertical segments totaling length Vmax_updated, as stated above.

As shown in FIG. 10, a horizontal or vertical segment of a route may similarly be moved to a different location in the path by breaking the path at one end of the segment to be moved and at the location to which the segment is to be moved, and then shifting the portion of the path between these breakpoints in a direction which brings the endpoints of the old segment together. For illustrative purposes these horizontal or vertical segments 110, 111 are shown in FIG. 11 as being equally divided between the beginning (source end) and end (sink end) of the path, but they may appear at any equal distance from the source on all paths, or may be broken into pieces such that corresponding pieces in all paths are of equal length and appear at an equal distance from the source.

Figure 11:
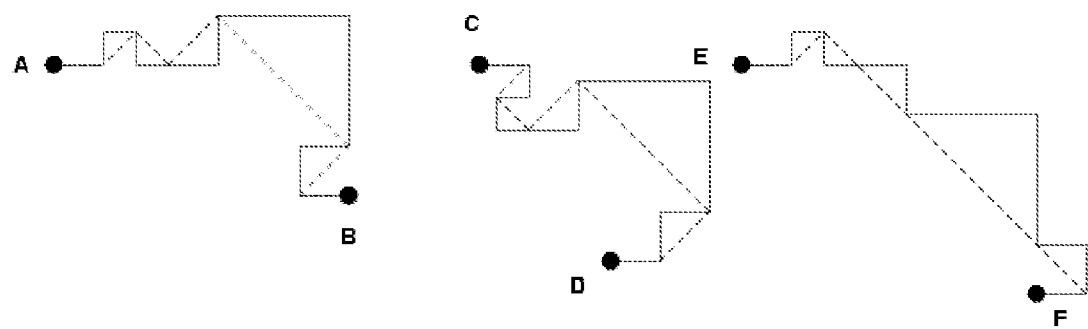

Once these matching paths have been constructed they are used to construct wire routes using only horizontal and vertical wire segments, as shown in FIG. 11. Beginning at the same end of each path (e.g., the source), the path is traversed until the start of a diagonal segment is reached. Because horizontal or vertical segments will have previously been placed at equal distances from the source, the first diagonal segment will be encountered at the same distance from the source on all paths. The shortest diagonal segment Dmin among those on all paths is then found, and a pair of horizontal and vertical wire segments each of length Dmin/square_root(2) is inserted between the endpoints of this diagonal length on all paths. The horizontal and vertical segments may be inserted in either order, but the order must be the same on all paths. From the end of this diagonal segment the beginning of the next diagonal segment (which in some paths may be a continuation of a diagonal segment longer than Dmin) the process repeats, finding the shortest of the diagonal segments on all paths and replacing it by a pair of vertical and horizontal segments. This continues until the sink of the path has been reached.

In yet another embodiment of the invention, a set of previously constructed wiring routes is modified to reduce the variation in their pairwise delay differences in the presence of process variation. The previously constructed wiring routes might have been constructed by one or more of the preceding methods, or by some other means. Even for wiring routes constructed using the above methods, residual variation in delay difference may exist due to tolerances in the above steps, variations in sink loadings, or other reasons. One method of modifying these previously constructed wiring routes uses sensitivity signature components which are a set of derivatives that collectively form a delay sensitivity signature as described above. It also uses coordinates of intermediate segments in the wiring route, which are those not connecting directly to the path source or sink. These coordinates are the x coordinates of vertical segments and the y coordinate of horizontal segments. The invention computes derivatives of each of the sensitivity signature components with respect to coordinates of intermediate segments. These derivatives are used to guide the movement of these intermediate segments (and consequently the shortening or lengthening of the segments to which they connect) in directions which would move the sensitivity signature components for a particular path toward the mean values for that sensitivity signature component among the routes to be matched. Care must be taken in making these changes so that a change does not cause more movement of some other sensitivity component away from its mean than the movement it causes of the selected component toward its mean. Such changes might be made in small steps with derivatives being recomputed between them in order to account for nonlinearities in the relationships between the sensitivity signature components and the coordinates of intermediate segments. Thus, one idea of the invention is to create routes for two or more source (beginning) to sink (end) wiring paths such that the paths traverse wire segments of similar lengths on the same wiring levels and in the same order, in order to reduce the difference between the delays of the two wiring paths in the presence of process variation which may alter the characteristics of the wire segments from their nominal values.

Figure 12:
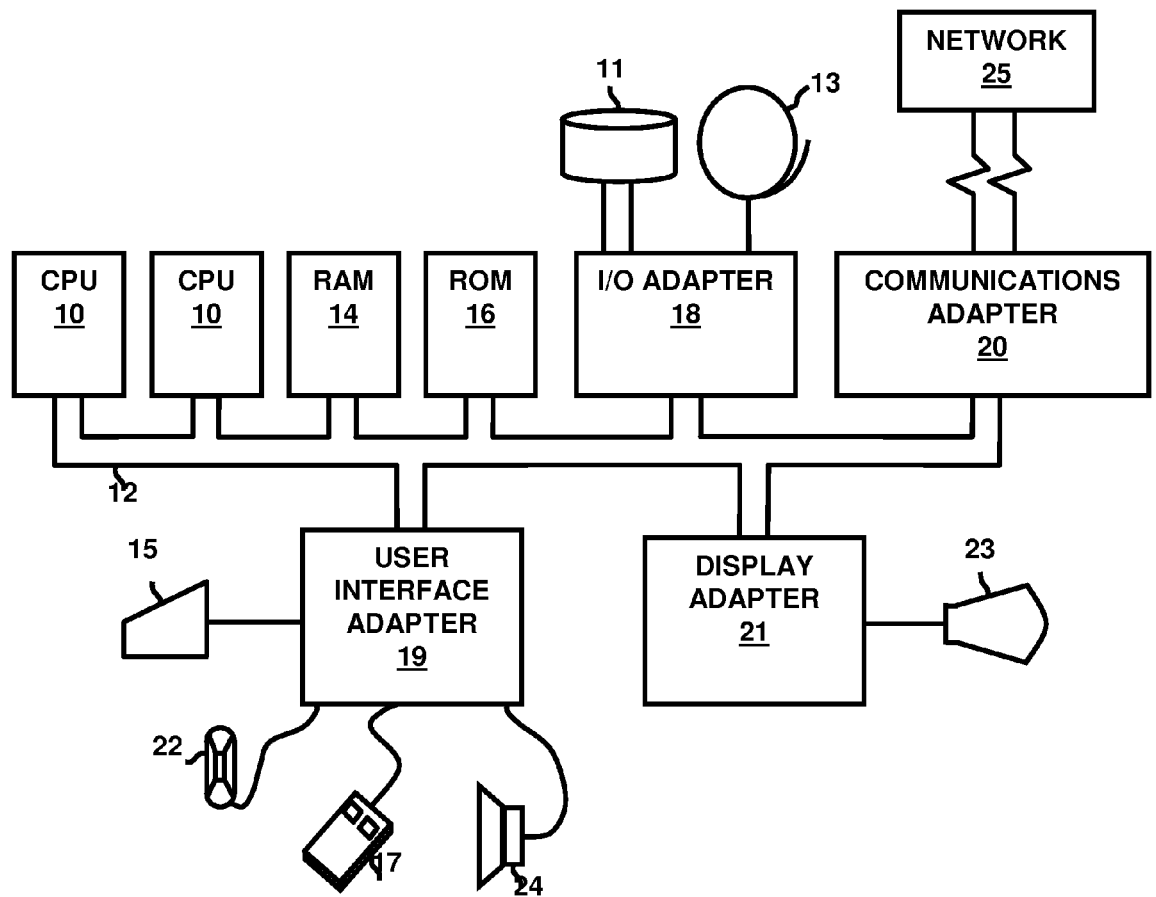
FIG. 12 is a hardware system for operating the invention.

A representative hardware environment for practicing the embodiments of the invention is depicted in FIG. 12. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The invention creates balanced wiring routes on an integrated circuit which have equal sensitivities to variation in the characteristics of the wiring layers with which the routes are implemented. A benefit of this invention is an improved ability to meet timing requirements on the integrated circuit, due to decreased variation in the differences between the delays of different paths. Another benefit is the ability to construct such balanced routes between predetermined pairs of source and sink points with minimal wiring. Yet another benefit of the invention is the ability to determine a topology for a signal distribution tree which allows for balanced routes to the sinks of the distribution tree to be constructed with minimal wiring.

While the invention has been described in terms of preferred embodiments, those skilled in the art will recognize that the invention can be practiced with modification within the spirit and scope of the appended claims.

What is claimed is:

1. A computer-implemented method of balancing delay in a wiring design of a multi-level integrated circuit, said method comprising:

providing, by a computer, nodes to be joined into said wiring design, wherein:

requirements of said wiring design provide that the time needed for a signal to travel along a first wiring path be about the same time needed for a signal to travel along a second wiring path;

said first wiring path and said second wiring path traverse multiple levels of said integrated circuit; and said multiple levels include a level comprising horizontal wiring segments and another level comprising vertical wiring segments; and designing, by said computer, said first wiring path and said second wiring path to traverse wire segments of about the same length within each level of said wiring design of said integrated circuit.

2. The method according to claim 1, wherein said designing further comprises making said first wiring path and said second wiring path traverse the same lengths of horizontal wiring segments and the same lengths of vertical wiring segments.

3. The method according to claim 1, wherein said designing further comprises:

matching a delay sensitivity signature of horizontal segment lengths of said first wiring path to a delay sensitivity signature of horizontal segment lengths of said second wiring path, and matching a delay sensitivity signature of vertical segment lengths of said first wiring paths to a delay sensitivity signature of vertical segment lengths of said second wiring path.

4. The method according to claim 1, wherein said designing further comprises lengthening one of said first wiring path and said second wiring path to match an approximate length of the other wiring path.

5. A computer-implemented method of balancing delay in a wiring design of a multi-level integrated circuit, said method comprising:

providing, by a computer, nodes to be joined into said wiring design, wherein requirements of said wiring design provide that the time needed for a signal to travel along a first wiring path be about the same time needed for a signal to travel along a second wiring path, and wherein said first wiring path and said second wiring path traverse multiple levels of said integrated circuit; and designing, by said computer, said first wiring path and said second wiring path to traverse wire segments of about the same length within each wiring level of said integrated circuit; and making, by said computer, said first wiring path and said second wiring path traverse the same lengths of horizontal wiring segments and the same lengths of vertical wiring segments in the same order within each wiring level of said integrated circuit.

6. The method according to claim 5, wherein said designing further comprises modifying a pre-existing wiring design.

7. The method according to claim 5, wherein said designing permits said first wiring path and said second wiring path to traverse said horizontal wiring segments and said vertical wiring segments in different directions.

8. The method according to claim 5, wherein said designing further comprises:

matching a delay sensitivity signature of horizontal segment lengths of said first wiring path to a delay sensitivity signature of horizontal segment lengths of said second wiring path, and matching delay sensitivity signature of vertical segment lengths of said first wiring paths to a delay sensitivity signature of vertical segment lengths of said second wiring path.

9. The method according to claim 5, wherein said designing further comprises lengthening one of said first wiring path and said second wiring path to match an approximate length of the other wiring path.

10. A non-transitory computer program storage medium readable by a computer, tangibly embodying a program of instructions executable by the computer to perform a method of balancing delay in a wiring design of an integrated circuit, said method comprising:

providing nodes to be joined into said wiring design, wherein:

requirements of said wiring design provide that the time needed for a signal to travel along a first wiring path be about the same time needed for a signal to travel along a second wiring path;

said first wiring path and said second wiring path traverse multiple levels of said integrated circuit; and said multiple levels include a level comprising horizontal wiring segments and another level comprising vertical wiring segments; and designing said first wiring path and said second wiring path to traverse wire segments of about the same length within each wiring level of said integrated circuit.

11. The non-transitory computer program storage medium according to claim 10, wherein said designing of said method further comprises making said first wiring path and said second wiring path traverse the same lengths of horizontal wiring segments and the same lengths of vertical wiring segments.

12. The non-transitory computer program storage medium according to claim 10, wherein said designing of said method further comprises:

matching a delay sensitivity signature of horizontal segment lengths of said first wiring path to a delay sensitivity signature of horizontal segment lengths of said second wiring path, and matching a delay sensitivity signature of vertical segment lengths of said first wiring paths to a delay sensitivity signature of vertical segment lengths of said second wiring path.

13. The non-transitory computer program storage medium according to claim 10, wherein said designing of said method further comprises lengthening one of said first wiring path and said second wiring path to match an approximate length of the other wiring path.

* * * * *